United States Patent [19]
Goldfarb

[11] Patent Number: 5,148,062

[45] Date of Patent: Sep. 15, 1992

[54] SIMPLIFIED PHASE SHIFTER CIRCUIT

[75] Inventor: Marc E. Goldfarb, Atkinson, N.H.

[73] Assignee: Raytheon Company, Lexington, Mass.

[21] Appl. No.: 810,616

[22] Filed: Dec. 19, 1991

[51] Int. Cl.$^5$ .......................... H03L 7/00; H03B 1/00; H03K 17/687; H03H 7/20
[52] U.S. Cl. .................... 307/511; 307/520; 307/241; 307/571; 328/155; 328/55; 333/139; 333/164
[58] Field of Search ............... 307/511, 513, 520, 241, 307/571, 262; 328/55, 155; 333/164, 139

[56] References Cited

U.S. PATENT DOCUMENTS

| | | | |
|---|---|---|---|
| 4,733,203 | 3/1988 | Ayasli | 307/571 |
| 4,893,035 | 1/1990 | Reynolds et al. | 307/520 |
| 4,963,773 | 10/1990 | Ayasli | 307/511 |
| 5,045,731 | 9/1990 | Riddle | 307/513 |

Primary Examiner—Janice A. Howell
Assistant Examiner—Trong Phan
Attorney, Agent, or Firm—Richard M. Sharkansky

[57] ABSTRACT

A phase shifter network which alternates between structurally dual networks is provided. In particular, the phase shifter has a topography which permits the network to be configured as alternatively T or π networks of low pass and high pass delay circuits in accordance with states of a single control signal fed to the phase shifter.

5 Claims, 3 Drawing Sheets

SIMPLIFIED PHASE SHIFTER CIRCUIT

BACKGROUND OF THE INVENTION

This invention relates generally to radio frequency circuits and, more particularly, to radio frequency circuits which provide a selected phase shift to a signal propagating therethrough.

As it is known in the art, phase shifter circuits are employed in various radio frequency (RF) applications such as phased array antenna systems and phase modulators. One type of phase shifter includes a first plurality of passive elements which provide a phase lag or negative phase shift network and a second, different plurality of passive elements which provide a phase lead or positive phase shift network. The phase lag and phase lead networks are configured between a pair of terminals of the phase shifter and with a pair of switches disposed to alternatively couple one of the networks to the pair of terminals at any time. Typically, each of the pair of switches is further provided by a pair of MESFETs or other suitable microwave switching devices. The MESFETs, for example, are fed complimentary control signals to select between one of the two transistors and hence one of two signal paths through either the phase lag or phase lead network. Thus, in accordance with the control signals fed to the transistors pair of switches, either the phase lag or the phase lead network is switched into the signal path to thus provide to a signal propagating therethrough a phase lag or a phase lead. The field effect transistors (such as MESFETs) are employed in these applications because they are easily formed as part of monolithic microwave integrated circuits unlike other types of active switching devices such as pin diodes.

A problem with this approach, however, is that since the filtering networks are provided using lumped elements such as inductors and capacitors, the circuits can be relatively large. This is particularly true at low microwave frequencies, where the elements, particularly the inductive elements, are very large and thus circuits fabricated with these devices are, likewise relatively large. This is undesirable for monolithic microwave integrated circuits from considerations of packaging, as well as cost. Moreover, the conventional approach requiring the use of a pair of input FETs and a pair of output FETs to provide the input and output switching likewise requires the use of complimentary control signals to switch the FETs. In applications of such phase shifters such as phased arrays and phase modulators, the above switching requires additional driving circuits to produce a complimentary control signal and, moreover, requires an additional control signal conductor to carry a complimentary signal to each one of the phase shifting elements.

SUMMARY OF THE INVENTION

In accordance with the present invention, a phase shifter network includes a pair of series coupled inductor elements and a capacitor element coupled in shunt between ground and a common connection of first ends of the pair of inductor elements. A first switching transistor is coupled between the common connection of the capacitor and the first one of the pair of inductor elements and a reference potential, and a second transistor is coupled between the common connection of the capacitor and a second one of the inductor elements and a reference potential. The circuit further includes a second capacitor and a third transistor having a first electrode coupled to the capacitor and a second electrode coupled to one end of the second inductor with a second end of the capacitor being coupled to a second end of the first inductor. The control electrodes of each one of the transistors are coupled to a common terminal and an input terminal is provided between the common connection of the first inductor and second capacitor and an output terminal is provided between the common connection of the third transistor and second inductor. With this particular arrangement, a simplified phase shift network is provided having fewer passive components than the prior art techniques. Moreover, the phase shift network is placed in either the high pass $\pi$ network or low pass T network configuration in accordance with the state of the three switching elements disposed in the circuit. Unlike the prior approaches in which the switches select either a high pass or a low pass network, here the inductor elements of the circuit are used in both the high pass and low pass configurations thus reducing the size of the circuit. Further, the network needs only one control signal with the true state of the control signal providing one state of the phase shifter and the complimentary state of said control signal providing the other state of the phase shifter. This simplifies system construction since only one control signal need be sent to a phase shifter circuit and there is no need to provide two control lines to the circuit or generate the second control signal for the circuit.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
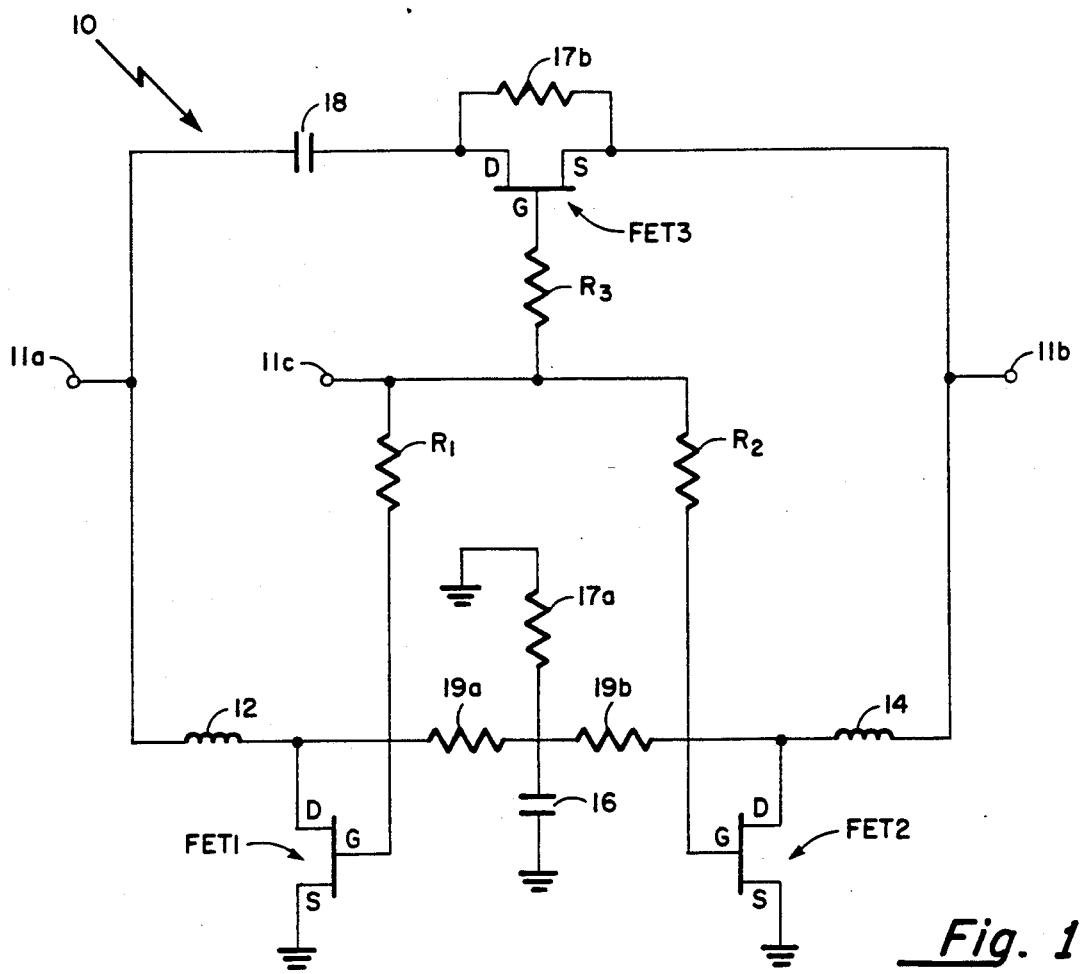
FIG. 1 is a schematic representation of a first embodiment of the phase shifter in accordance with the present invention.
Figure 1A:
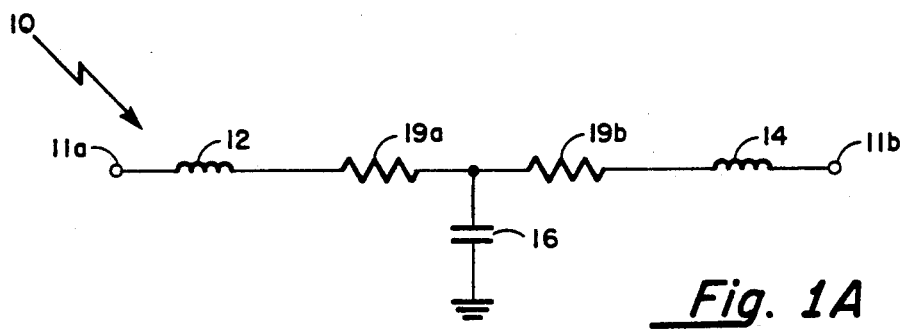
FIG. 1A is an equivalent circuit of FIG. 1 showing a low pass T network to provide phase lag to an input signal propagating therethrough.
Figure 1B:
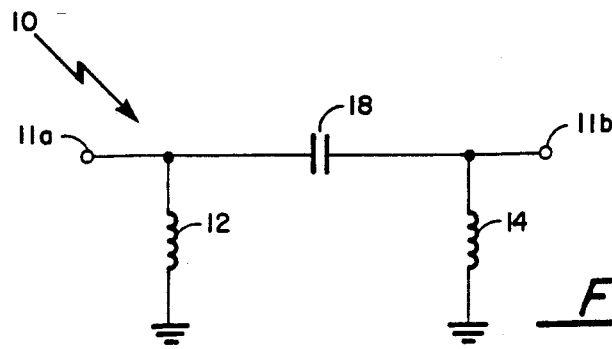
FIG. 1B is an equivalent circuit of FIG. 1 showing the circuit of FIG. 1 configured as a high pass T network to provide phase lead to a signal propagating therethrough.

Referring now to FIGS. 1, 1A, and 1B, a phase shifter 10 is shown having an input terminal 11a and an output terminal 11b. Coupled between the input terminal 11a through a first path is a first inductor element 12, provided as a spiral inductor as will be described, having a first end coupled to terminal 11a and a second end coupled to a first switching element such as a field effect transistor FET1, as shown. The transistor FET1 has drain and source electrodes coupled between the inductor 12 and a reference potential, ground, as well as a control or gate electrode coupled via a resistor R1 to a control terminal 11c. The inductor 12 is also coupled to an optional resistance 19a used to correct for insertion loss imbalances in the network in its different configurations, as will be described. The second end of resistor 19a is coupled to a shunt mounted capacitor 16 and shunt mounted resistor 17a, and to a second, optional compensating resistor 19b, as shown. The second end of resistor 19b is coupled to a second switching device, a field effect transistor FET2, having source and drain electrodes coupled between the resistor 19b and a reference potential, ground, with a control or gate electrode coupled via a resistor R2 to control terminal 11c. The second resistor 19b is also coupled to a second inductor 14, as shown. The resistor 17a is coupled in shunt between the common connection of resistors 19a, 19b and ground. The second end of inductor 14 is coupled to the output terminal 11b. A second path is provided between terminals 11a and 11b through a second capacitor 18 and through a series coupled field effect transistor FET3 having drain and source electrodes coupled between the capacitor 18 and the output terminal 11b with a control or gate electrode G coupled via a third resistor R3 to control terminal 11c. A resistor 17b is coupled across source and drain electrodes of transistor FET3. Resistor 17a is used to bias drain and source electrodes of FET3 at the same potential and resistor 17b is used to bias drain and source electrodes of FET1, FET2 at the same potential.

Operation of the circuit, as described in conjunction with FIG. 1, is as follows: A single control signal is fed to the switching devices FET1-FET3. A first state of the control signal is used to configure the circuit as either a low pass T network to provide phase lag to a signal propagating therethrough, whereas a second, different state of the control signal is used to configure the circuit as a high pass $\pi$ network to provide phase lead to a signal propagating therethrough. Thus the circuit is used to provide a differential phase shift of here 180° between the state of the circuit configured as a low pass network and the state of the circuit configured as a high pass network.

In particular, referring to FIG. 1A, with a control signal fed to terminal 11c to place transistors FET1-FET3 in a nonconducting state, the network of FIG. 1 is shown configured as a low pass T network. In particular, since the transistors FET1-FET3 are in a nonconducting state, capacitor 18 (FIG. 1) is effectively removed from the circuit and thus an electrical path is provided between terminal 11a and terminal 11b through the inductor 12 which is coupled in series with resistors 19a and 19b, as well as second inductor 14, with a shunt path provided by capacitor 16. This arrangement of elements, as illustrated in FIG. 1A, provides the circuit 10 configured as a low pass T network providing a predetermined phase lag to a signal propagating between terminal 11a and terminal 11b.

As illustrated in FIG. 1B in the alternate state of circuit 10, a signal is fed to terminal 11c to place transistors FET1-FET3 in a conducting state thus completing a signal path between capacitor 18 and output terminal 11b, as well as providing a pair of shunt paths around the resistors 19a, 19b and capacitor 16 thereby coupling inductors 12 and 14 directly to ground. Placing transistors FET1-FET3 in a conducting state provides the circuit, as shown in FIG. 1B, having capacitor 18 as a series element of the $\pi$ network and inductors 12 and 14 as the shunt elements of the network. This arrangement of the circuit provides the network 10 having a high pass filter characteristic.

In particular, it should be noted that circuit 10 alternates between either a low pass or a high pass network using the same inductor elements 12 and 14 as the inductor elements in both filter configurations. Thus, unlike the prior approaches in which a signal path is alternated between either a high pass network or an independently configured low pass network requiring the use of separate passive components for the high pass and low pass networks and thus a concomitant increase in circuit area, this arrangement provides a more compact circuit arrangement since some of the same components, the same inductor elements, are used in both filter configurations. Moreover, since the inductor elements are generally the largest elements in the circuit, the filter is also relatively compact.

Further still, since the above configuration permits a single control signal to control switching between the high pass and low pass sections, it obviates the need for complimentary switches and attendant driver circuits and control lines to control a phase shifter requiring true and compliment control signals. This provides a particular advantage in applications employing a large number of these circuits such as a phased array antenna elements.

The amplitude balancing resistors 19a and 19b are provided in the circuit to slightly increase the insertion loss of the circuit when the circuit is configured in the low pass T network configuration. Thus, providing the circuit in the low pass, as well as high pass networks, having substantially the same insertion loss characteristics over a relatively broad range of operating frequencies. The use of these resistors compensates somewhat for the resistance associated with transistor FET3 when FET3 is in its on state. A certain amount of resistance is provided in the path through the capacitor 18 from FET3 in its "on" state thus somewhat increasing the insertion loss of the path between the terminals 11a and 11b when FET1-FET3 are in their "on" states. Depending on the actual characteristics of the transistors and passive components, however, these resistors may not be necessary. In general, the resistance of all the resistors except resistors 19a and 19b is chosen to be sufficiently high enough such that they have no substantial effect on RF performance.

Figure 2:
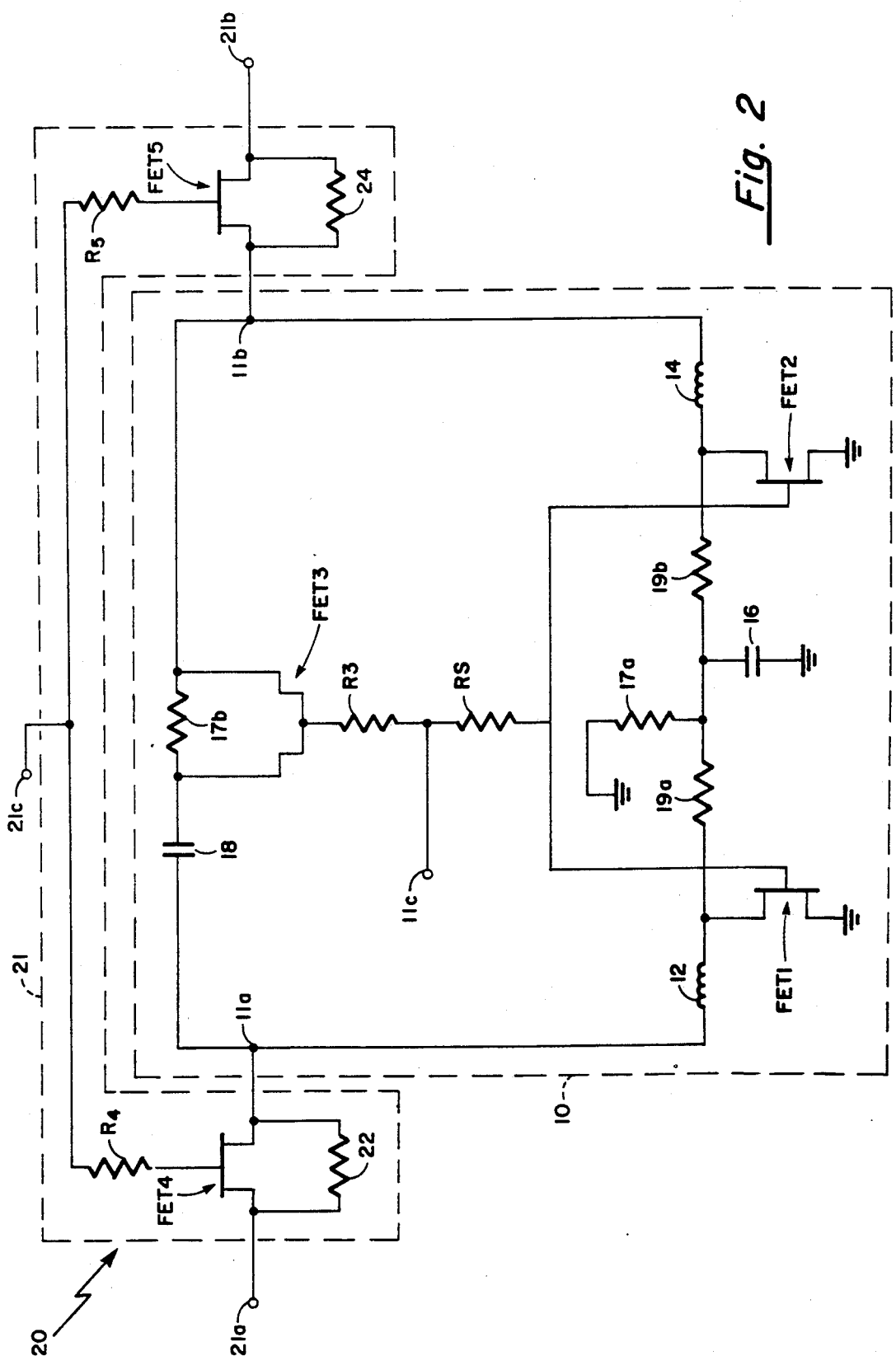
FIG. 2 is a schematic representation of an alternate embodiment of a phase shifter having a variable attenuator in accordance with a further aspect of the present invention.

Referring now to FIG. 2, an alternate embodiment 20 of the phase shifter is shown to include the phase shifter 10 of FIG. 1 having an attenuation network 21 integrated with the phase shift circuit 10. In particular, the attenuator network 21 includes fourth and fifth switching devices field effect transistors FET4, FET5 coupled in series between input electrodes 11a, 11b of the phase shifter and output electrodes 21a, 21b, respectively of the attenuator/phase shifter 20, as shown. Disposed in shunt across source and drain electrodes of FET4 and FET5 are corresponding resistors 22 and 24. The gate or control electrodes of each one of the transistors FET4 and FET5 are provided to a second control terminal 21c whereas the control electrode of transistor FET3 is coupled to terminal 11c as in FIG. 1. In operation, when transistor FET3 is placed in its low impedance state (as would also be FET1, FET2), capacitor C18 is effectively coupled to terminal 11b through FET3 as above. A control signal fed to terminal 21c permits the resistors 22 and 24 be selectively coupled and decoupled into the signal path between terminals 21a and 21b thus providing a selective resistive characteristic to the signal path and thus a selective attenuation characteristic thereto. The signal at terminal 21c, however, operates independently of the signal at terminal 11c with the signal at terminal 21c effectively only controlling a degree of attenuation whereas the signal at terminal 11c controlling the state of the phase shifter.

The circuit in FIG. 2 is fabricated on gallium arsenide having a thickness of 25 mils with a ground plane conductor disposed over a first, lower surface thereof. Formed over a second, upper surface of the substrate are the elements illustrated in FIG. 2. In particular, the switching elements FET1–FET5 are metal semiconductor field effect transistors with each of the transistors having selected gate peripheries of 700 microns for transistors FET1, FET2, 1,400 microns for transistor FET3, and 1,000 microns for transistors FET4, FET5. Each of the resistors R3–R5, as well as resistors 22 and 24, has a value of resistance of typically 4,000 ohms, whereas resistors 19a and 19b have a value of resistance of 23 ohms. A resistor Rs is coupled between terminal and the gates of FET1 and FET2. Capacitor C16 has a value of capacitance of 2.1 pf (picofarads) whereas capacitor C18 has a capacitance of 2.6 pf. Inductor 12 and inductor 14 are identical, each having an inductance of 5.2 nH (nanohenries). Inductors 12 and 14 are spiral inductors having 5.5 turns with a total conductive length of 4048 microns. Each conductor has a width of 20 microns and each inductor having a total outer length of 320 microns with a spacing of 10 microns between each of the spiralled conductors. The circuit is designed to operate having a 10% bandwidth over the frequency range centered at about 1.25 gigahertz. Enhancement mode MESFET field effect transistors are used although depletion mode metal semiconductor field effect transistors could alternatively be used.

Figure 3A:
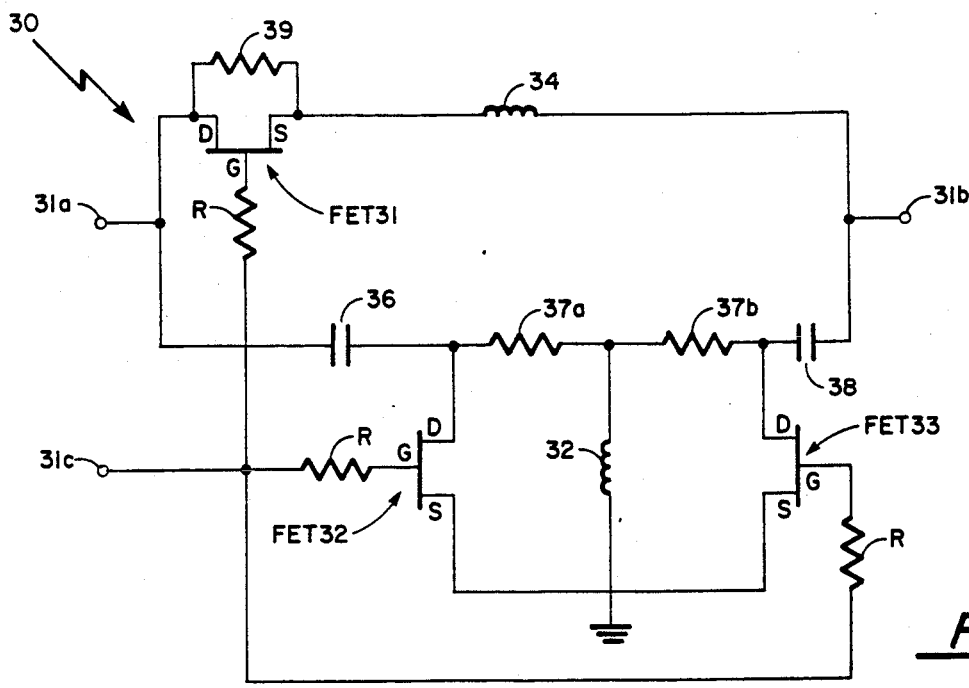
FIGS. 3A–3C are schematic representations and equivalent circuits respectively of an alternate embodiment of a phase shifter in accordance with the present invention.
Figure 3B:
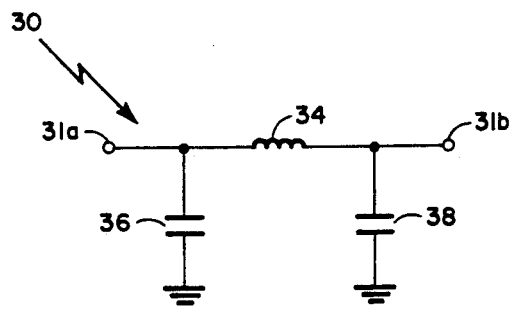
Figure 3C:
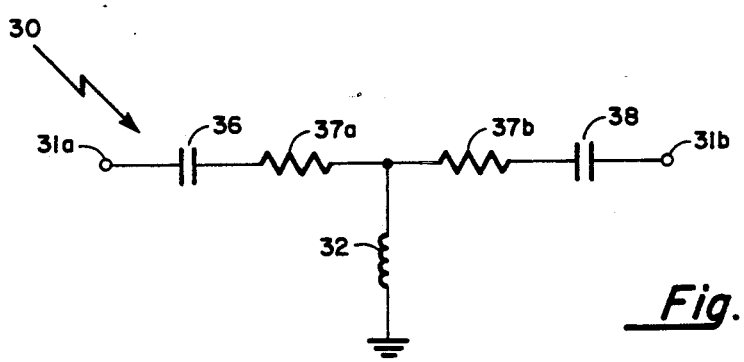

Referring now to FIGS. 3A–3C, an alternate embodiment of phase shifter 30 is shown having input terminal 31a and output terminal 31b. Coupled between input terminal 31a through a first signal path is a first transistor FET31 having drain and source electrodes with drain and source electrodes having a resistor 39 coupled to them and coupling in series a first inductor 34. Thus, the first signal path between terminals 31a and 31b is provided through transistor FET31 and inductor 34, as illustrated. A second signal path is provided between a pair of series coupled capacitors 36 and 38 with a pair of amplitude balancing resistors 37a, 37b coupling said capacitors 36, 38 in series with a shunt mounted inductor 32 coupled between the common connection of resistors 37a, 37b and ground and having a second pair of transistors FET32, FET33 coupled in shunt across inductor 32, as shown. Transistors FET31–FET33 have control or gate electrodes coupled to a common control terminal 31c through resistors R.

When the signal at terminal 31c places transistors FET31–FET33 in their low impedance or conducting states, the circuit 30 as illustrated in FIG. 3B is provided. That is, the circuit is a low pass π network having inductor 34 as a series element of the network with capacitors 36 and 38 as shunt elements of the network. Alternatively, as illustrated in FIG. 3C, when the signal on terminal 31c places transistors FET31–FET33 in their nonconducting or high impedance states, the phase shifter 30 has, as illustrated in FIG. 3C, capacitors 36 and 38 and resistors 37a, 37b coupled in series between terminals 31a and 31b with inductor 32 coupled between the common connection of said capacitors and ground.

As the embodiment illustrated in conjunction with FIGS. 1, 1A, and 1B, this embodiment also uses some of the same components to provide the low pass and high pass configurations of the circuit 30. Furthermore, this arrangement is also provided with only a single control signal being fed to the phase shifter. Capacitors 36 and 38 are used in both a low pass and high pass configurations of the circuit 30.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A phase shifter network comprising:
    a pair of inductors, each one thereof having a first end serially coupled to a common junction;
    a capacitor element coupled in shunt between a reference potential and the common junction;
    a first switching device having one input thereof coupled to the common junction and the first end of a first one of the pair of inductor elements and a second input thereof coupled to the reference potential;
    a second switching device having one input thereof coupled to the common junction and the first end of a second one of the inductor elements and a second input thereof coupled to the reference potential;
    a second capacitor having a first electrode coupled to an input terminal network; and
    a transistor having a pair of electrodes with a first one of the electrodes of the transistor coupled to a second electrode of said second capacitor and a second one of said electrodes of the transistor being coupled to an output terminal network with a control electrode of said transistor being coupled to control electrodes of said first and second switching devices and to a common control terminal of the network.

2. The circuit, as recited in claim 1, wherein said first and second switching devices are field effect transistors.

3. The circuit of claim 2 further comprising:
    a pair of resistors, a first one thereof being coupled between the first end of the first one of the pair of inductors and the common junction and a second one of the pair of resistors being coupled between the first end of the second one of the pair of inductors and the common junction.

4. A phase shifter comprising:
    a first transistor having a pair of electrodes, a first one of said electrodes being coupled to an input terminal of, the network;
    a first inductor, having a first end coupled to a second one of the electrodes of said first transistor and a second end coupled to an output terminal of the network;
    a pair of capacitors having first ends coupled to a junction and being coupled in series between the input and output electrodes of the network;
    a second inductor coupled between the junction and a reference potential;

a second transistor coupled between the first end of a first one of said capacitors and said reference potential; and a third transistor coupled between the first end of a second one of said capacitors and said reference potential.

5. The phase shifter of claim 4 further comprising:
a pair of resistors having first ends connected to said first ends of said pair of capacitors and second ends of said pair of resistors connected to the junction.

* * * * *